United States Patent
Shi

(10) Patent No.: US 10,644,161 B2
(45) Date of Patent: May 5, 2020

(54) LTPS-BASED CMOS COMPONENT AND METHOD FOR MANUFACTURING THE SAME

(71) Applicant: Shenzhen China Star Optoelectronics Technology Co., Ltd., Shenzhen, Guangdong (CN)

(72) Inventor: Longqiang Shi, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 58 days.

(21) Appl. No.: 15/329,335

(22) PCT Filed: Jan. 16, 2017

(86) PCT No.: PCT/CN2017/071286
§ 371 (c)(1),
(2) Date: Oct. 17, 2017

(87) PCT Pub. No.: WO2018/040482
PCT Pub. Date: Mar. 8, 2018

(65) Prior Publication Data
US 2018/0342625 A1 Nov. 29, 2018

(51) Int. Cl.
*H01L 29/786* (2006.01)
*H01L 27/12* (2006.01)
(Continued)

(52) U.S. Cl.
CPC .......... *H01L 29/78612* (2013.01); *H01L 21/823807* (2013.01); *H01L 27/092* (2013.01);
(Continued)

(58) Field of Classification Search
CPC ......... H01L 29/78612; H01L 29/78696; H01L 29/78675; H01L 21/823807;
(Continued)

(56) References Cited

U.S. PATENT DOCUMENTS

2001/0042889 A1* 11/2001 Kang .............. H01L 21/823807
257/371
2005/0012087 A1 1/2005 Sheu et al.
(Continued)

FOREIGN PATENT DOCUMENTS

| CN | 101150072 | 3/2008 |
|---|---|---|
| CN | 102881657 | 1/2013 |
| CN | 106169473 | 11/2016 |

OTHER PUBLICATIONS

Search report and Written Opinion, dated May 31, 2017, for International Application No. PCT/CN2017/071286.
(Continued)

*Primary Examiner* — Mohammed R Alam

(57) ABSTRACT

Disclosed are an LTPS-based CMOS component and a method for manufacturing the same. The CMOS component includes an NMOS type LTPS. PN junctions are provided in an NMOS type LTPS channel to reduce the movement speed of electrons in the channel, so that hot electron effects can be avoided. The LTPS-based CMOS component can reduce the movement speed of electrons and avoid hot electron effects.

1 Claim, 3 Drawing Sheets

(51) Int. Cl.
*H01L 27/092* (2006.01)
*H01L 21/8238* (2006.01)
*H01L 29/66* (2006.01)

(52) U.S. Cl.
CPC .... *H01L 27/1214* (2013.01); *H01L 29/66757* (2013.01); *H01L 29/78618* (2013.01); *H01L 29/78675* (2013.01); *H01L 29/78696* (2013.01)

(58) Field of Classification Search
CPC ........... H01L 29/66757; H01L 21/8238; H01L 29/10; H01L 27/092; H01L 21/823412
See application file for complete search history.

(56) References Cited

U.S. PATENT DOCUMENTS

2007/0040174 A1\* 2/2007 Kim .................... H01L 27/1214
257/59
2014/0295627 A1\* 10/2014 Sun ..................... H01L 27/1214
438/157
2018/0366498 A1\* 12/2018 Deng ................ G02F 1/136227

OTHER PUBLICATIONS

Office Action and Search Report, dated Dec. 5, 2017, for Chinese Patent Application No. 201610794123.6.

\* cited by examiner

| P-Si | | P-Si |
|---|---|---|
| SiOx | | SiOx |
| SiNx | | SiNx |
| GLA | | GLA |

Fig. 1a

| N-Si | | P-Si |
|---|---|---|
| SiOx | | SiOx |
| SiNx | | SiNx |
| GLA | | GLA |

Fig. 1b

| P+-Si | N-Si | P+-Si | P+-Si | P-Si | P+-Si |
|---|---|---|---|---|---|
| SiOx | | | SiOx | | |
| SiNx | | | SiNx | | |
| GLA | | | GLA | | |

Fig. 1c

| | GI | | | GI | |
|---|---|---|---|---|---|
| P+-Si | N-Si | P+-Si | P+-Si | P-Si | P+-Si |
| SiOx | | | SiOx | | |
| SiNx | | | SiNx | | |
| GLA | | | GLA | | |

Fig. 1d

| | G | | | G | |
|---|---|---|---|---|---|
| | GI | | | GI | |
| P+-Si | N-Si | P+-Si | P+-Si | P-Si | P+-Si |
| SiOx | | | SiOx | | |
| SiNx | | | SiNx | | |
| GLA | | | GLA | | |

Fig. 1e

| ILD | | | ILD | | |
|---|---|---|---|---|---|
| | G | | | G | |
| | GI | | | GI | |
| P+-Si | N-Si | P+-Si | P+-Si | P-Si | P+-Si |
| SiOx | | | SiOx | | |
| SiNx | | | SiNx | | |
| GLA | | | GLA | | |

Fig. 1f

LTPS-BASED CMOS COMPONENT AND METHOD FOR MANUFACTURING THE SAME

CROSS-REFERENCE TO RELATED APPLICATIONS

This application claims the priority of Chinese patent application CN 201610794123.6, entitled "LTPS-based COMS component and method for manufacturing the same" and filed on Aug. 31, 2016, the entirety of which is incorporated herein by reference.

FIELD OF THE INVENTION

The present disclosure relates to the technical field of semiconductors, and in particular, to an LTPS-based COMS component and a method for manufacturing the same.

BACKGROUND OF THE INVENTION

Low Temperature Poly-silicon (LTPS) has been extensively studied because it has high mobility and can be used to fabricate CMOS components.

A complementary metal oxide semiconductor (CMOS) is composed of a negative metal oxide semiconductor (NMOS) and a positive metal oxide semiconductor (PMOS). Due to high mobility of electrons in NMOS components, hot electron effects are likely to occur under strong electric fields, thereby damaging the components.

One of the solutions to solve the above problem in the prior art is to manufacture an NMOS LTPS component having a lightly doped drain (LDD) structure. However, due to the introduction of N—Si doping, one more process is added, which increases production costs.

SUMMARY OF THE INVENTION

In order to solve the above problem, the present disclosure provides an LTPS-based COMS component and a method for manufacturing the same, so as to reduce the movement speed of electrons and to avoid hot electron effects.

According to one of aspect of the present disclosure, an LTPS-based CMOS component is provided, which comprises an NMOS type LTPS.

An NMOS type LTPS channel is provided therein with PN junctions to reduce movement speed of electrons in the channel, so as to avoid hot electron effects.

According to one embodiment of the present disclosure, both ends of the NMOS type LTPS channel are provided with P-type heavily doped regions, so that PN junctions are formed between the P-type heavily doped regions and the NMOS type LTPS channel.

According to one embodiment of the present disclosure, the NMOS type LTPS channel is provided therein with a P-type heavily doped region, so that PN junctions are formed between the P-type heavily doped region and the NMOS type LTPS channel.

According to one embodiment of the present disclosure, the P-type heavily doped region is located in the middle of the NMOS type LTPS channel.

According to one embodiment of the present disclosure, the NMOS type LTPS further comprises a buffer layer, which is provided under a channel layer where the NMOS type LTPS channel is located; a gate insulating layer, which is provided on the channel layer where the NMOS type LTPS channel is located and on exposed portions of the buffer layer; a gate layer, which is provided on the gate insulating layer; a dielectric layer, which is provided on the gate layer and exposed portions of the gate insulating layer; and a source and a drain, which are provided on the dielectric layer and are respectively in communication with both ends of the NMOS type LTPS channel by means of via holes.

According to one embodiment of the present disclosure, the NMOS type LTPS further comprises a buffer layer, which is provided under a channel layer where the NMOS type LTPS channel is located; a gate insulating layer, which is provided on the channel layer where the NMOS type LTPS channel is located and on exposed portions of the buffer layer; a gate layer, which is provided on the gate insulating layer; a dielectric layer, which is provided on the gate layer and exposed portions of the gate insulating layer; and a source and a drain, which are disposed on the dielectric layer and are respectively in communication with both ends of the NMOS type LTPS channel by means of via holes.

According to one embodiment of the present disclosure, the LTPS-based CMOS component further comprises a PMOS type LTPS. The PMOS type LTPS comprises a buffer layer, which is provided on a glass substrate; a channel layer, which is provided on the buffer layer; a gate insulating layer, which is provided on a PMOS type LTPS channel layer and exposed portions of the buffer layer; a gate layer, which is provided on the gate insulating layer; a dielectric layer, which is provided on the gate layer and exposed portions of the gate insulating layer; and a source and drain, which are provided on the dielectric layer and are respectively in communication with both ends of a PMOS type LTPS channel by means of via holes.

According to another aspect of the present disclosure, a method for manufacturing an LTPS-based CMOS component is further provided. The method comprises the following steps.

A buffer layer is formed on a glass substrate.

PMOS type UPS channel layers are formed in a corresponding PMOS region and a corresponding NMOS region on the buffer layer.

The PMOS type LTPS channel layer in the NMOS region is lightly n-doped to form an NMOS type LTPS channel layer.

Both ends of a channel in the NMOS type channel layer and both ends of a channel of the PMOS type LTPS channel layer in the PMOS region are heavily p-doped.

A gate insulating layer is formed on the NMOS type LTPS channel layer, the PMOS type LTPS channel layer, and exposed portions of the buffer layer.

A gate layer is formed on the gate insulating layer.

A dielectric layer is formed on the gate layer and exposed portions of the gate insulating layer, and via holes are formed by etching on the dielectric layer for connecting the P-type heavily doped regions at both ends of the channel in the NMOS type channel layer and connecting the P-type heavily doped regions at both ends of the channel in the PMOS type TPS channel layer.

A source and a drain of the CMOS component are formed on the dielectric layer, the source and the drain being in communication with corresponding P-type heavily doped regions by means of the via holes.

According to further another aspect of the present disclosure, another method for manufacturing an LTPS-based CMOS component is further provided. The method comprises the following steps.

A buffer layer is formed on a glass substrate.

PMOS type LTPS channel layers are formed in a corresponding PMOS region and a corresponding NMOS region on the buffer layer.

A middle region of a channel of the PMOS type channel layer in the NMOS region is heavily p-doped.

The channel in the PMOS type LTPS channel layer in the NMOS region is lightly n-doped to form an NMOS type LTPS channel layer.

Both ends of the NMOS type LTPS channel layer are heavily n-doped.

Both ends of the channel in the PMOS type LTPS channel layer in the PMOS region are heavily p-doped.

A gate insulating layer is formed on the NMOS type LTPS channel layer, the PMOS type LTPS channel layer, and exposed portions of the buffer layer.

A gate layer is formed on the gate insulating layer.

A dielectric layer is formed on the gate layer and exposed portions of the gate insulating layer, and via holes are formed by etching on the dielectric layer for connecting the P-type heavily doped regions at both ends of the channel in the NMOS type LTPS channel layer and connecting the P-type heavily doped regions at both ends of the channel in the PMOS type LTPS channel layer.

A source and a drain of the CMOS component are formed on the dielectric layer, the source and the drain being respectively in communication with each of the corresponding P-type heavily doped regions by means of the via holes.

According to one embodiment of the present disclosure, the step of heavily n-doping both ends of the channel in the NMOS type LTPS channel layer may be swapped with the step of heavily n-doping both ends of the channel of the PMOS type LTPS channel layer.

The present disclosure has the following beneficial effects. With respect to the complicated LDD process, the present disclosure provides PN junctions in an NMOS type LTPS channel, so that the movement speed of electrons can be reduced and hot electron effects can be avoided.

Other advantages, objects, and features of the present disclosure will be further explained in the following description, and to some extent, would be obvious to those skilled in the art based on study of the following description. Or, those skilled in the art may obtain teachings from practice of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure and constitute one part of the description. The drawings are used for interpreting the technical solutions of the present disclosure together with the embodiments, not for limiting the present disclosure. In the drawings:

FIG. 1a schematically shows a component structure corresponding to a step for fabrication of a PMOS LTPS according to one embodiment of the present disclosure;

FIG. 1b schematically shows a component structure corresponding to the step for fabrication of an NMOS LTPS according to one embodiment of the present disclosure;

FIG. 1c schematically shows a component structure corresponding to the step for P-type heavy doping according to one embodiment of the present disclosure;

FIG. 1d schematically shows a component structure corresponding to the step for fabrication of a gate insulating layer according to one embodiment of the present disclosure;

FIG. 1e schematically shows a component structure corresponding to the step for fabrication of a gate layer according to one embodiment of the present disclosure;

FIG. 1f schematically shows a component structure corresponding to the step for fabrication of a dielectric layer according to one embodiment of the present disclosure;

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. As long as there is no structural conflict, all the technical features mentioned in all the embodiments may be combined together in any manner, and the technical solutions obtained in this manner all fall within the scope of the present disclosure.

In order to solve the problem of the complicated LDD process in the prior art, the present disclosure provides a CMOS component which prevents hot carrier effects of NMOS type LTPS.

The CMOS component comprises an NMOS type LTPS. An NMOS type LTPS channel is provided therein with PN junctions to reduce movement speed of electrons in the channel, so as to avoid hot electron effects.

Figure 2:
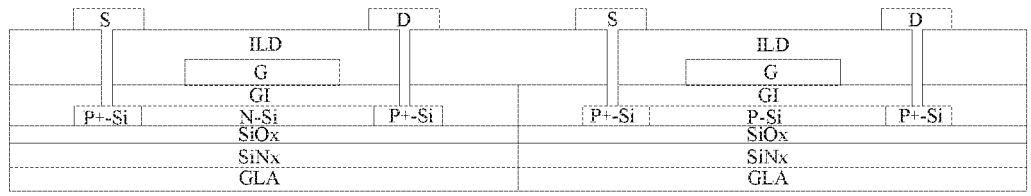
FIG. 2 schematically shows a component structure corresponding to the step for fabrication of a source and a drain according to one embodiment of the present disclosure.

FIG. 2 schematically shows a structure of an NMOS type LTPS according to one embodiment of the present disclosure. As shown in FIG. 2, the NMOS type LTPS comprises in order from bottom to top: a buffer layer which is formed on a glass substrate GLA, the buffer layer comprising a SiNx layer provided on the glass substrate GLA and a SiOx layer provided on the SiNx layer; an NMOS type LTPS channel layer which is provided on the buffer layer, the channel layer comprising an N-type channel N—Si and P-type heavily doped regions P+-Si which are located at both ends of the channel and are respectively in communication with a source and a drain; a gate insulating layer GI which is provided on the NMOS type LTPS channel layer and exposed portions of the buffer layer; a gate layer which is provided on the gate insulating layer for forming a gate pattern G; a dielectric layer ILD which is provided on the gate layer and exposed portions of the gate insulating layer GI; and a source S and a drain D which are provided on the dielectric layer ILD and are respectively in communication with both ends of the NMOS type LTPS channel.

Specifically, as shown in FIG. 2, P-type heavily doped regions P+-Si rather than N-type heavily doped regions are provided in regions where the source and the drain are in contact with the NMOS type LTPS, so that PN junctions are formed between the P-type heavily doped regions and the NMOS type LTPS channel. In this way, a structure of a P+NP+ type transistor is formed in a channel region of the NMOS type LTPS. P+ represents P-type heavy doping, and N+ represents N-type heavy doping. When a current flows from the drain D to the source S, a diode formed by P+N is turned on in a forward direction and the current is unimpeded. However, NP+ forms a zener diode. An advantage of a zener diode is the formation of a small depletion region, and when electrons pass through the depletion region, the movement speed thereof is slowed down. The electrons can pass through the depletion region, but do not damage the device like an avalanche diode. This solves the problem of hot electron effects caused by the high movement speed of the electrons, and solves the problem of a source and a drain being in contact with an LTPS. Thus, two photomasks corresponding to an N-type heavy doping N+ and an N-type light doping N− can be saved, while an LDD structure is formed.

Figure 4:
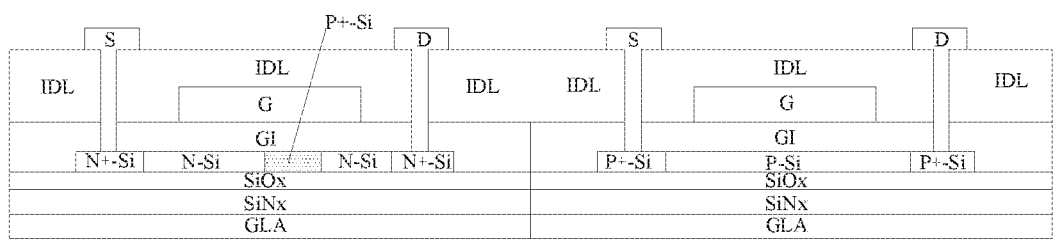
FIG. 4 schematically shows a component structure corresponding to the step for fabrication of a source and a drain according to one embodiment of the present disclosure.

FIG. 4 schematically shows a structure of an NMOS type LTPS according to another embodiment of the present disclosure. As shown in FIG. 4, a P-type heavily doped region is provided in a channel region of the NMOS type LTPS, so that PN junctions are formed between the P-type heavily doped region and the channel region of the NMOS type LTPS. By performing a P-type heavy doping process in the middle of the NMOS type LTPS channel, an NP+N transistor structure is formed. In the structure, a P+ type LTPS can be compared to a hurdle and the movement speed of electrons may be reduced to a certain extent when electrons get across the hurdle, Thus, hot electron effects can be avoided and photomasks required in N-type light doping N− can be saved. Other structures in the channel region of the NMOS type LTPS are the same as those in FIG. 2, and are not described here in detail.

In one embodiment of the present disclosure, the LTPS-based CMOS component further comprises a PMOS type LTPS. The PMOS type LTPS and the NMOS type LTPS form a complete CMOS component. As shown in FIGS. 2 and 4, the PMOS type LTPS comprises in order from bottom to top: a buffer layer which is provided on a glass substrate GLA, the buffer layer comprising a SiNx layer provided on the glass substrate GLA and a SiOx layer provided on the SiNx layer; a PMOS type LTPS channel layer which is provided on the buffer layer, the channel layer comprising a P-type channel P—Si and P-type heavily doped regions P+—Si which are located at both ends of the channel and are respectively in communication with a source and a drain; a gate insulating layer GI which is provided on the PMOS type LTPS channel layer and exposed portions of the buffer layer; a gate layer which is provided on the gate insulating layer for forming a gate pattern G; a dielectric layer ILD which is formed on the gate layer and exposed portions of the gate insulating layer GI; and a source S and drain D which are provided on the dielectric layer ILD and are respectively in communication with both ends of the channel of the PMOS type LTPS.

According to another aspect of the present disclosure, a method for manufacturing an LTPS-based CMOS component is further provided. The method specifically comprises the following steps.

First, a buffer layer is formed on a glass substrate. Specifically, a SiNx layer is formed on the substrate GLA by CVD (Chemical Vapor Deposition), and then a SiOx layer is formed on the SiNx layer.

Next, a PMOS type LTPS channel layer and an NMOS type LTPS channel layer are formed on the buffer layer. The PMOS type LTPS channel layer comprises a P-type channel P—Si, and P-type heavily doped regions P+-Si which are located at both ends of the P-type channel P—Si and are respectively in communication with a source and a drain. The NMOS type LTPS channel layer comprises an N-type channel N—Si, and P-type heavily doped regions P+-Si at both ends of the channel and in communication with a source and a drain.

Specifically, in the formation of the PMOS type LTPS channel layer and the NMOS type LTPS channel layer, an amorphous silicon (a-Si) film is first formed on the buffer layer by CVD. Then, the a-Si film is exposed to light and etched to form an a-Si island pattern, and the a-Si island pattern is crystallized by ELA to obtain a P-type LTPS, as shown in FIG. 1a. Next, the obtained LTPS is coated with a photoresist and exposed to light, and an NMOS region of the LIPS is lightly n-doped, and then the photoresist is removed to form an NMOS type LTPS pattern (NMOS type LTPS channel layer), as shown in FIG. 1b. Next, the LTPS is again coated with a photoresist and exposed to light, and both ends of the channel of the PMOS type LTPS channel layer and both ends of the channel of the NMOS type LTPS channel layer are heavily p-doped, i.e., both ends of the a-Si silicon island pattern are heavily p-doped. And then, the photoresist is removed to form P+-Si patterns, as shown in FIG. 1c.

Next, a gate insulating layer GI is formed on the NMOS type LTPS channel layer, the PMOS type LTPS channel layer, and exposed portions of the buffer layer by CVD, as shown in FIG. 1d.

Next, a gate layer is formed on the gate insulating layer GI. Specifically, a metal film is formed on the gate insulating layer GI by the physical vapor deposition (PVD), and then a gate is formed by means of exposure and development, as shown in FIG. 1e.

Next, a dielectric layer ILD is formed on the gate layer and exposed portions of the gate insulating layer, and via holes are formed by etching on the dielectric layer for connecting the P-type heavily doped regions at both ends of the channel in the NMOS type channel layer and connecting the P-type heavily doped regions at both ends of the channel in the PMOS type LTPS channel layer. Specifically, the dielectric layer is formed by CVD, and then IDL layer patterns are formed by exposure and dry etching, as shown in FIG. 1f.

Finally, a source and a drain of the CMOS component are formed on the dielectric layer IDL, and the source and the drain are respectively in communication with corresponding P-type heavily doped regions by means of the via holes. Specifically, a metal film is formed by PVD first, and then a source pattern and a drain pattern are respectively formed by exposure and development. The source and the drain are in communication with a source region and a drain region corresponding to the NMOS type LTPS and PMOS type LTPS by means of the via holes, as shown in FIG. 2.

According to further another aspect of the present disclosure, another method for manufacturing an LTPS-based CMOS component is further provided. The method specifically comprises the following steps.

First, a buffer layer is formed on a glass substrate GLA. Specifically, a SiNx layer is formed on the substrate GLA by CVD, and then a SiOx layer is formed on the SiNx layer.

Figure 3A:
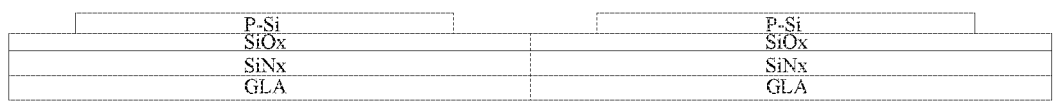
FIG. 3a schematically shows a component structure corresponding to the step for fabrication of a PMOS LTPS according to one embodiment of the present disclosure.

Next, PMOS type EPS channel layers are formed in a corresponding PMOS region and a corresponding NMOS region on the buffer layer, as shown in FIG. 3*a*.

Figure 3B:
FIG. 3b schematically shows a component structure corresponding to the step for P-type heavy doping of a channel according to one embodiment of the present disclosure.

Next, an inner region of a channel in the PMOS type LTPS channel layer in the NMOS region is heavily p-doped to obtain a P-type heavily doped region P+-Si, as shown in FIG. 3*b*. Specifically, a photoresist PR is applied to the PMOS type LTPS channel layers. A region of the channel in the PMOS type LTPS channel layer in the NMOS region, preferably a middle region of the channel, is irradiated with a semi-transparent photomask, to remove the photoresist in the region, and then the region where the photoresist is removed is heavily p-doped to obtain a P-type heavily doped LTPS.

Figure 3C:
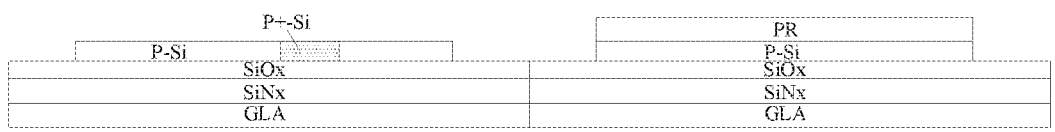
FIG. 3c schematically shows a component structure corresponding to the step for fabrication of an NMOS LTPS according to one embodiment of the present disclosure.

Next, the photoresist corresponding to the NMOS is etched away by dry etching, and the photoresist corresponding to PMOS is reserved, as shown in FIG. 3*c*.

Figure 3D:
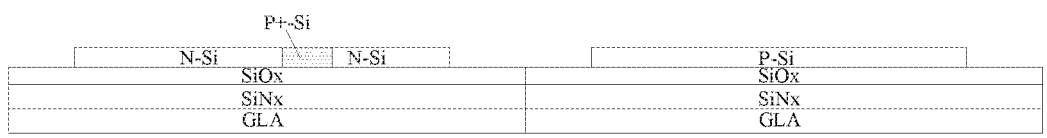
FIG. 3d schematically shows a component structure corresponding to the step for performing N-type light doping on an NMOS according to one embodiment of the present disclosure.

Next, the LTPS channel in the NMOS region is lightly n-doped, and then the photoresist is removed to form an NMOS type LTPS pattern (NMOS type LTPS channel layer), as shown in FIG. 3*d*.

Figure 3E:
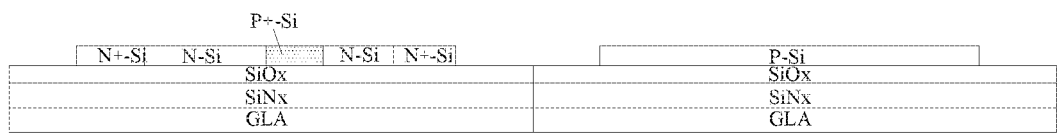
FIG. 3e schematically shows a component structure corresponding to the step for an N-type heavy doping process according to one embodiment of the present disclosure.

Next, the process of photoresist coating and exposure is further performed, and both ends of an a-Si silicon island pattern of the LTPS in the NMOS region is heavily n-doped, and then the photoresist is removed to form N+-Si patterns, as shown in FIG. 3*e*.

Figure 3F:
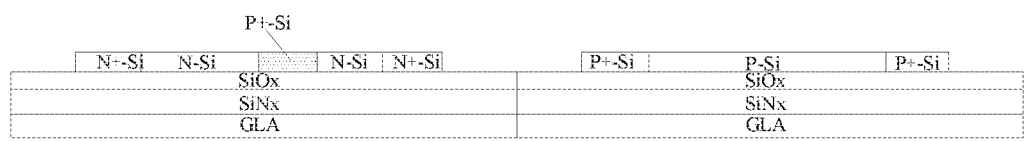
FIG. 3f schematically shows a component structure corresponding to the step for a P-type heavy doping process according to one embodiment of the present disclosure.

Next, the process of photoresist coating and exposure is further performed, and both ends of the a-Si silicon island pattern of the LTPS in the PMOS region is heavily p-doped, and then the photoresist is removed to for a P+-Si patterns, as shown in FIG. 3*f*.

Next, a gate insulating layer GI is formed on the NMOS type LTPS channel layer, the PMOS type LTPS channel layer, and exposed portions of the buffer layer by CVD.

Next, a gate layer is formed on the gate insulating layer GI. Specifically, a metal film is formed on the gate insulating layer GI by PVD, and then a gate is formed by exposure and development.

Next, a dielectric layer ILD is formed on the gate layer and exposed portions of the gate insulating layer, and via holes are formed by etching on the dielectric layer for connecting the P-type heavily doped regions at both ends of the channel in the NMOS type channel layer and connecting the P-type heavily doped regions at both ends of the channel in the PMOS type TPS channel layer. Specifically, the dielectric layer is formed by CVD, and IDL layer patterns are formed by exposure and dry etching.

Finally, a source and a drain of the CMOS component are formed on the dielectric layer, and the source and the drain are respectively in communication with corresponding P-type heavily doped regions by means of the via holes. Specifically, a metal film is formed by PVD, and then a source pattern and a drain pattern are respectively formed by exposure and development. The source and the drain are in communication with a source region and a drain region respectively corresponding to the NMOS type LTPS and the PMOS type LTPS by means of the via holes, as shown in FIG. 4.

The step of performing an N-type heavy doping process to form the N+—Si pattern may be swapped with the step of performing a P-type heavily doping process to form the P+—Si pattern.

The above embodiments are described only for better understanding, rather than restricting the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A Low Temperature Poly-silicon (LTPS)-based complementary metal oxide semiconductor component, comprising: a channel layer, wherein a negative metal oxide semiconductor (NMOS)-type LTPS channel is located in the channel layer, a P-type heavily doped region is provided in a middle of the NMOS-type LTPS channel, and an N-type heavily doped region is provided at each end of the NMOS-type LTPS channel; a buffer layer, arranged under the channel layer, wherein the buffer layer further comprises a silicon nitride (SiNx) buffer layer and a silicon oxide (SiOx) buffer layer, and the silicon oxide buffer layer is in contact with the channel layer; a gate insulating layer, arranged on the channel layer and covering the entire channel layer and exposed portions of the buffer layer; a gate layer, arranged on the gate insulating layer, being narrower than the NMOS-type LTPS channel, and surrounded by a dielectric layer; the dielectric layer, arranged on the gate layer and exposed portions of the gate insulating layer; and a source electrode and a drain electrode, arranged on the dielectric layer, wherein the source electrode is connected to one end of the NMOS-type LTPS channel, and the drain electrode is connected to the other end of the NMOS-type LTPS channel by means of via holes.

* * * * *